United States Patent [19]

Imamura et al.

[11] Patent Number: 5,138,204
[45] Date of Patent: Aug. 11, 1992

[54] ADJUSTABLE DELAY UTILIZING A MIRROR CAPACITANCE DISCHARGING A CONSTANT CURRENT IN THE SATURATION AND LINEAR REGIONS OF A MIRROR AMPLIFIER

[76] Inventors: Makoto Imamura; Hisaki Arasawa; Jun Kohno, all of 9-32-2, Nakacho, Musashinoshi, Tokyo, Japan

[21] Appl. No.: 750,495

[22] Filed: Aug. 27, 1991

[30] Foreign Application Priority Data

Sep. 28, 1990 [JP] Japan .................................. 2-259607
Feb. 20, 1991 [JP] Japan .................................... 3-26197
Jul. 1, 1991 [JP] Japan ................................... 3-160414

[51] Int. Cl.$^5$ .......................... H03K 5/13; B23K 3/02
[52] U.S. Cl. .................................. 307/601; 307/603; 307/608; 307/362; 307/265; 328/55
[58] Field of Search ................... 328/60, 63, 127, 183, 328/184, 185, 55; 307/228, 268, 326, 601, 603, 608, 597, 269, 265

[56] References Cited

U.S. PATENT DOCUMENTS

| | | | |
|---|---|---|---|
| 4,001,698 | 1/1977 | Allred | 307/601 |
| 4,359,649 | 11/1982 | Mündel | 307/268 |
| 4,620,312 | 10/1986 | Yamashita | 307/603 |
| 4,837,466 | 6/1989 | Kanauchi | 307/601 |
| 5,041,747 | 8/1991 | Chengson et al. | 307/601 |

Primary Examiner—Stanley D. Miller
Assistant Examiner—Toan Tran

[57] ABSTRACT

A timing generator, which is simple in structure, has high linearity, and operates at high speeds, is realized by varying the equivalent input capacitance of a mirror amplifier. The mirror capacitance is electrically discharged with a constant current in the saturation region and in the linear region of the amplifier. The voltage at the inverting input terminal of the mirror amplifier is compared with a constant value to produce a delay. When the delay is produced in the linear region, where the inclination of the ramp waveform is mild, the period of the delay is accurately varied by input data. Thus, the period of the delay can be set with high accuracy, and high resolution. In the saturation region, where the inclination of the ramp waveform is steep, the voltage is compared with a constant value. Thus, the timing generator is made immune to noise, even if the delay time is lengthy.

6 Claims, 8 Drawing Sheets

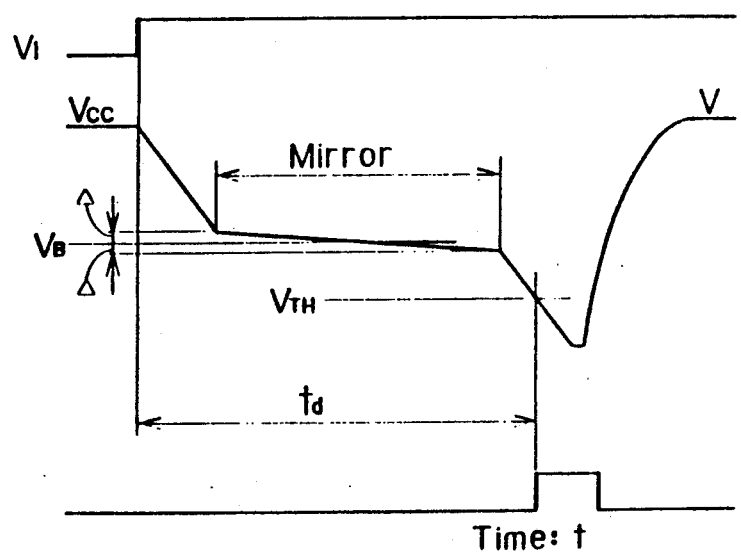
Fig.3(A) Input Signal
Fig.3(B) Node Voltage $V_N$
Fig.3(C) Output Signal $V_o$
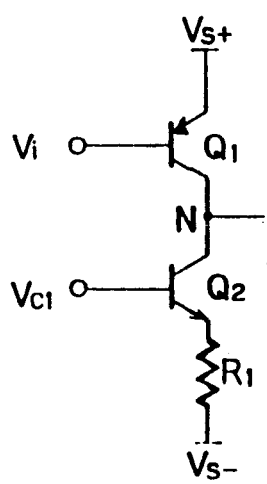
Fig.4
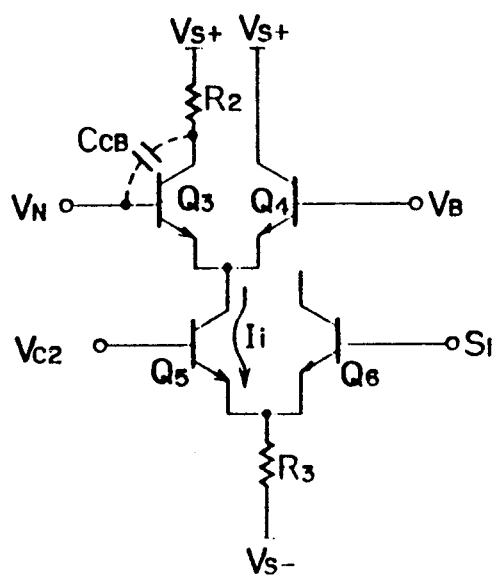
Fig.5

Fig.6
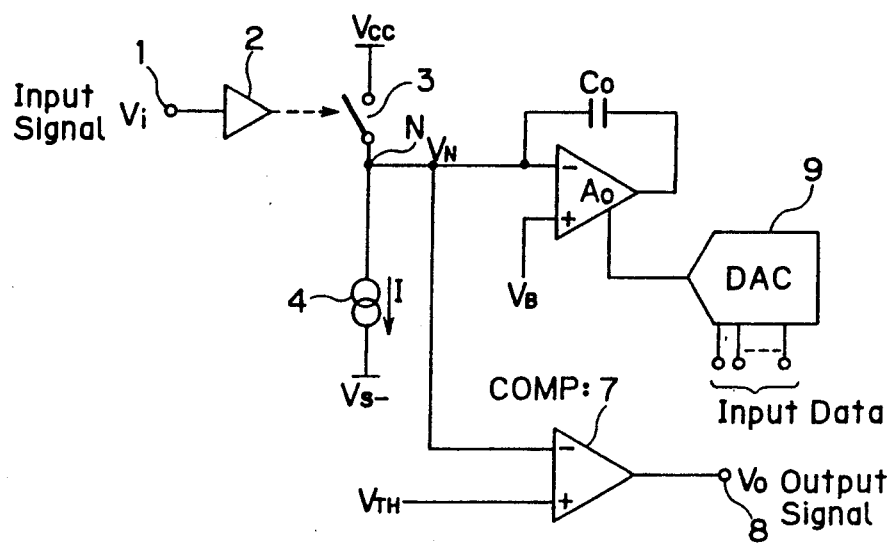
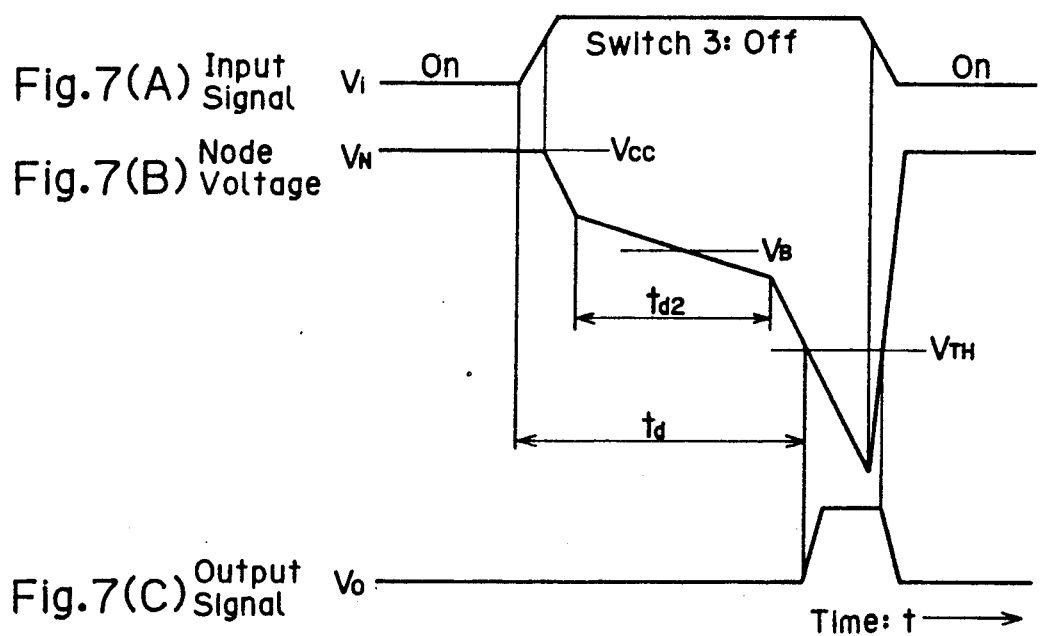
Fig.7(A) Input Signal
Fig.7(B) Node Voltage
Fig.7(C) Output Signal

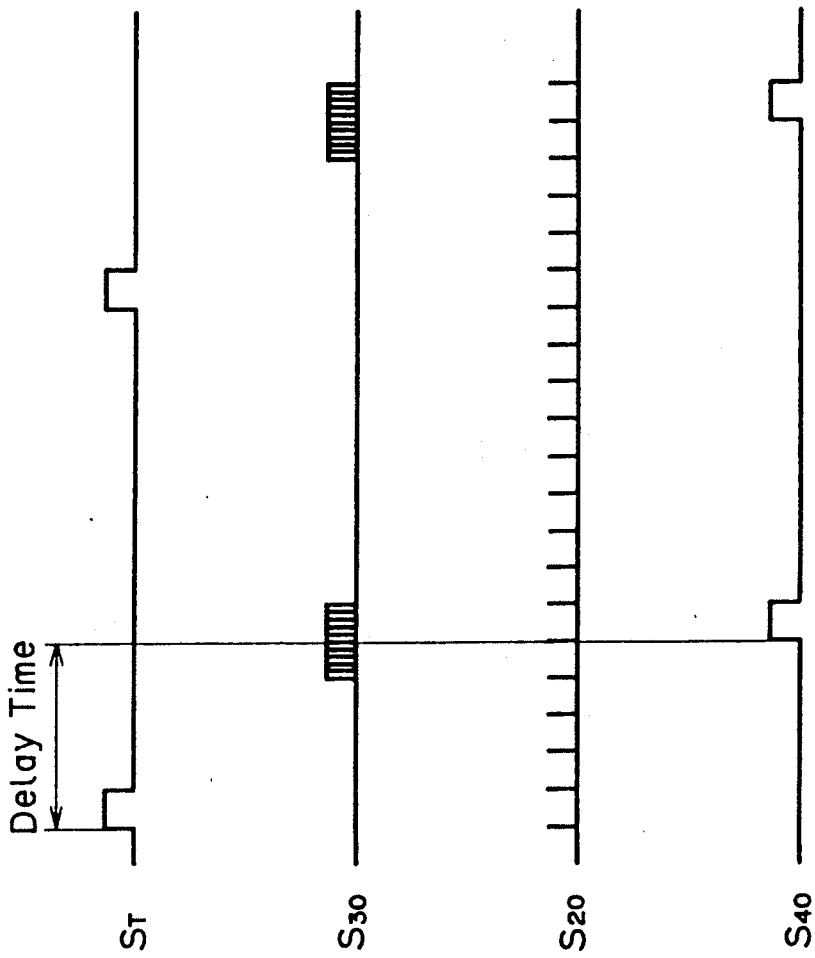

ADJUSTABLE DELAY UTILIZING A MIRROR CAPACITANCE DISCHARGING A CONSTANT CURRENT IN THE SATURATION AND LINEAR REGIONS OF A MIRROR AMPLIFIER

BACKGROUND OF THE INVENTION

1. Field of Invention

This invention relates to a timing generator which is capable of delaying its input timing signal in such a way that the delay time can be set with high accuracy and high resolution.

2. Description of the Prior Art

In the prior art, timing generators have been used to accurately determine the timing of measurements being made, for example, by systems for inspecting digital LSIs. FIG. 1 is a waveform diagram illustrating operation of a first type of conventional timing generator which converts incoming digital values into corresponding analog output $V_{in}$, and compare such analog output with a ramp waveform a to obtain a delay time $t_d$. A second type of conventional timing generator selects several of a number of delay gates.

In the first type of conventional timing generator, the ramp waveform must be linear. Also, a high quality capacitor is needed. The repetition frequency is limited by the ramp waveform. Furthermore, the circuit configuration is complex because a high speed digital to analog converter is required.

The second type of conventional timing generator has a large scale configuration. With this type of timing generator, it is necessary to make uniform the differences between the successively switched delay amounts. It is difficult to obtain good linearity and monotonicity.

SUMMARY OF THE INVENTION

Accordingly, an object of the invention is to overcome the afore-mentioned and other deficiencies and disadvantages of the prior art.

Another object is to provide a timing generator which is simple in structure, shows good linearity and operates at high speed.

The foregoing and other objects and advantages are attained by the invention which encompasses a timing generator comprising a mirror amplifier having a capacitor connected between an inverting input terminal and an output terminal of the amplifier; a switch connected between the inverting input terminal and a constant voltage source; a constant current source for electrically discharging the equivalent input capacitance of the mirror amplifier in the saturation region and in the linear region of the amplifier; a setting means for setting the equivalent input capacitance produced in the linear region of the mirror amplifier according to input data; and a comparator which compares the voltage produced at the inverting input terminal in the saturation region with a second voltage after the linear region of the amplifier is passed. The mirror amplifier comprises a combination of differential amplifier and the above mentioned capacitor. After the switch is turned "off", in response to the input timing signal, the comparator produces a signal with a given delay.

In one embodiment of the invention, the setting means is a control circuit which turns "on" and "off" the mirror amplifier in response to the input data.

In another embodiment, the setting means is a digital to analog converter which controls the amplitude of the output signal from the mirror amplifier in response to the input data.

BRIEF DESCRIPTION OF THE DRAWINGS

FIGS. 3(A)-3(C) are timing charts depicting operation of the embodiment of FIG. 2.

FIG. 4 is a circuit diagram depicting a specific example of a part of the embodiment of FIG. 2.

FIG. 5 is a circuit diagram depicting a specific example of another part of the embodiment of FIG. 2.

FIG. 6 is a block diagram depicting another illustrative embodiment of the invention.

FIGS. 7(A)-7(C) are timing charts depicting operation of the embodiment of FIG. 6.

FIGS. 12(A)-12(D) are timing charts depicting the operation of the circuit of FIG. 11.

DETAILED DESCRIPTION OF THE PREFERRED EMBODIMENTS

Figure 2:
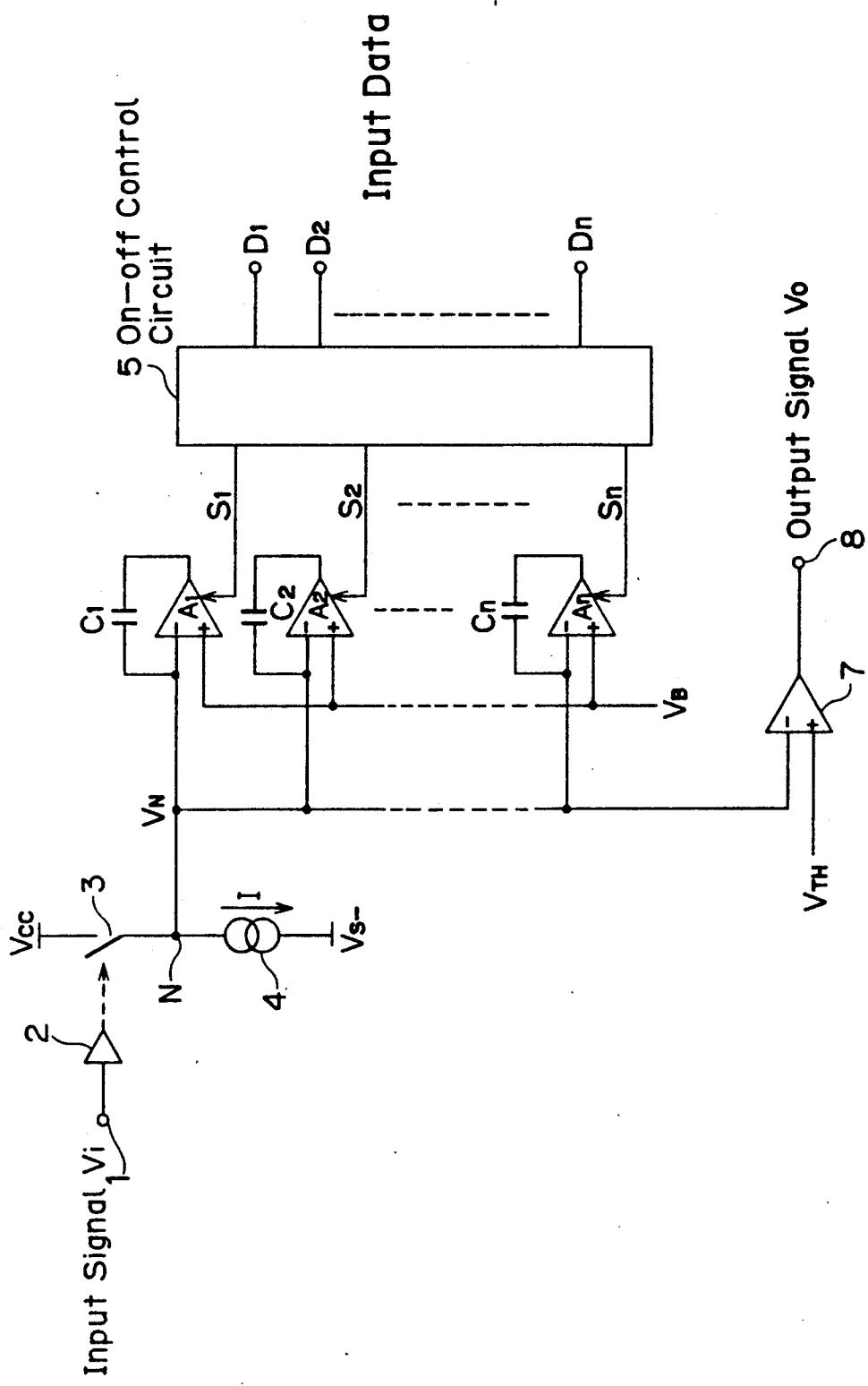
FIG. 2 is a block diagram depicting an illustrative embodiment of the invention.

Referring to FIG. 2, the invention comprises an input terminal 1, a buffer amplifier 2, a switch 3, a constant current source 4, a plurality of differential amplifiers $A_l-A_n$, which can be turned ON and OFF from the outside, a plurality of capacitors $C_l-C_n$, a comparator 7, a control circuit 5, and an output terminal 8. A timing signal $V_i$ is applied to the input terminal 1 and then supplied to buffer amplifier 2. Switch 3 is turned ON and OFF by the output signal from buffer amplifier 2. A positive voltage source (shown symbollically as $V_{cc}$) applies a first voltage $V_{cc}$ to one end of switch 3. One end of constant current source 4 is connected to the other end of switch 3. A negative voltage source (shown symbollically as $V_{s-}$) applies a second voltage $V_{s-}$ to the other end of current source 4. All the inverting input terminals of differential amplifiers $A_l-A_n$ are connected to node N of switch 3 and current source 4. A third voltage source (shown symbolically as $V_B$) impresses a voltage $V_B$ on all the noninverting input terminals of amplifiers $A_l-A_n$.

Capacitors $C_l-C_n$ form capacitances via which the output terminals of amplifiers $A_l-A_n$ are connected to their respective inverting input terminals. Comparator 7 compares the voltage developed at the interconnected inverting input terminals of amplifiers $A_l-A_n$, with a fourth voltage $V_{TH}$, and produces a delayed timing signal at output terminals 8. Control circuit 5 receives input data $D_l-D_m$ and delivers control signals $S_l-S_n$ in response to the input data, to turn ON and OFF amplifiers $A_l-A_n$.

Control circuit 5 forms a setting means for setting the equivalent input capacitance produced in the linear region of each mirror amplifier according to the input data. Each mirror amplifier comprises a combination of amplifier $A_i$ and capacitance $C_i$. First voltage $V_{cc}$ second voltage $V_{s-}$, third voltage $V_B$, and fourth voltage $V_{TH}$ have the following relationship:

$$V_{cc} > V_B > V_{hd\,TH} > V_{s-} \qquad (1)$$

The operation of the FIG. 2 embodiment is now described with reference to the timing charts of FIGS. 3(A)-3(C). The points at which amplifiers $A_1-A_n$ are turned ON and OFF are previously set by control signals $S_1-S_n$ produced by control circuit 5 according to input data $D_1-D_m$ which represent delay times. When amplifiers $A_1-A_n$ are all turned OFF, the equivalent input capacitance $C_{off}$ applied to node N is given by $$C_{off} = C_s + \Xi C_i \qquad (2)$$

wherein Cs is the stray capacitance. Thus, when input timing signal $V_i$ (see FIG. 3(A)) turns OFF switch 3, capacitance $C_{off}$ is electrically discharged by constant current source 4. The voltage at node N varies with time, as given by the following equation:

$$V_N = V_{cc} - (I/C_{off}) \cdot t \qquad (3)$$

When the relation $V_N = V_{TH}$ is reached, the output signal from comparator 7 goes high. At this time, the delay time $t_d$ is given by the following equation:

$$t_d = (V_{cc} - V_{TH}) C_{off}/I \qquad (4)$$

When any one $A_i$ of amplifiers $A_1-A_n$ is turned ON, voltage $V_N$ at the node behaves in the manner specified by equations (2) and (3) within the region in which amplifier $A_i$ is saturated. In the linear input region of the amplifier which is located near voltage $V_B$ and given by the following relationship:

$$V_B + \Delta > V_B > V_{B\Delta} \qquad (5)$$

amplifier $A_i$ and capacitor $C_i$ together operate as a mirror integrator.

It follows that a mirror capacitance is added to node N. This is because the amplitude of the output signal from amplifier $A_i$ swings by $V_H - V_L$, permitting electric charge $C_i(V_H - V_L)$ to flow into corresponding capacitor $C_i$. Since the charge is supplied from current source 4, electric current I is consumed by the mirror capacitance during a period which is equivalent to the following equation:

$$t_{di} = C_i(V_H - V_L)/I \qquad (6)$$

Delay time $t_d$ is increased accordingly. Thus, delay time $t_d$ (see FIG. 3(B)) at this time is give by the following equation:

$$t_d = (V_{cc} - V_{TH}) C_{off}/I + \Xi\{(V_H - V_L)/I\} \cdot C_i \cdot Pi \qquad (7)$$

When amplifier $A_i$ is operating, Pi=1. When amplifier $A_i$ is not operating, Pi=0. Thus, the equivalent input capacitance produced in the linear region of the mirror amplifier is set according to the input data. As a result, a delayed timing signal $V_o$ (see FIG. 3(C)) whose delay time is controlled appears at output terminal 8.

FIG. 4 shows an example of a switch 3 and constant current source 4 which includes the embodiment of FIG. 2. In the various figures, the same components bear the same reference numerals. A transistor $Q_1$ forms switch 3. A transistor $Q_2$ and a resistor $R_1$ together form constant current source 4. The current value of the current source controlled by a voltage $V_{cl}$.

FIG. 5 shows an example of amplifier $A_i$ of the embodiment of FIG. 2. A load resistor $R_2$, transistors $Q_3$ and $Q_4$, together form a differential input circuit. A transistor $Q_5$ and a resistor $R_3$ together form a constant current source whose current value is controlled by a voltage $V_{c2}$. A transistor $Q_6$ forms a circuit which turns ON and OFF the constant current source. A positive voltage source $V_{s+}$ is connected to transistor $Q_3$ via load resistor $R_2$. Positive voltage source $V_{s+}$ is also connected directly to transistor $Q_4$. A negative voltage source $V_{s-}$ is connected to transistors $Q_5$ and $Q_6$ via resistor $R_3$. Stray capacitance $C_{CB}$ exists between the collector and base of transistor $Q_3$. Capacitor $C_i$ already described in connection with FIG. 2, can be omitted by using this stray capacitance.

Let $I_i$ be the constant current flowing through transistor $Q_5$. The amplitude $(V_H - V_L)$ of the output signal from this amplifier of FIG. 5 is given by $I_i \cdot R_2$. High resolution can be easily obtained by weighting the mirror capacitance using any of the following four methods:

(1) Constant current value $I_i$ is weighted with 1, 2, 4, etc, while maintaining constant the load resistance $R_2$ and stray capacitance $C_{CB}$.

(2) Load resistance $R_2$ is weighted with 1,2, 4, etc, while maintaining constant stray capacitance $C_{CB}$ and current value $I_i$.

(3) Constant current value $I_i$ and load resistance $R_2$ are maintained constant. Transistors are connected in parallel. Stray capacitance $C_{CB}$ is weighted with 1,2, 4, etc.

(4) A combination of methods (1),(2), and (3) is used.

The amplifier shown in FIG. 5 can be turned ON and OFF by turning ON and OFF the current source. This is turned ON and OFF when signal $S_i$ goes high and low, respectively.

The inventive timing generator is simple in structure. As an example, in order to realize 32 different stages of delay, only 5 differential amplifiers are needed. Thus, advantageously, low consumption of electric power and low cost are achieved.

Figure 1:
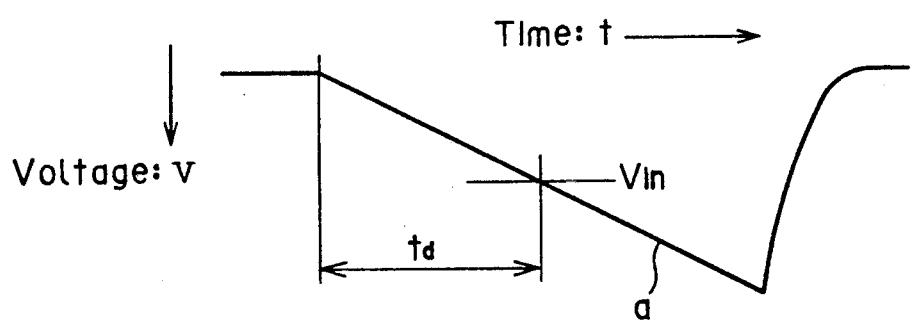
FIG. 1 is a waveform diagram depicting operation of a conventional timing generator.

In the conventional method shown in FIG. 1, using a ramp waveform, if delay time $t_d$ is set to be large, the inclination of the ramp waveform becomes less steep. The result is that the apparatus is vulnerable to noise. In the invention, a steep inclination (see FIG. 3(B)) is regained subsequent to the mirror region. Thus, the invention is immune to noise.

In the conventional method shown in FIG. 1, the period of the ramp waveform is constant. Thus, only a given repetition frequency is possible. On the other hand, with the invention, the repetition frequency can be set to large values wherein the delay time is short. In the mirror region, the delay time is determined by the amount of electric charge. Since the process of integration does not affect the linearity, the linearity is high. Additionally, the invention timing generator can be easily fabricated using integrated circuit techniques, since no LC circuits are required.

The full scale can be readily readjusted by varying the constant current value $I_i$ (see FIG. 5) or the current I (SEE FIG. 2), which would have been impossible to realize using the prior art gate delay system.

In the embodiment of FIG. 2, $A_i$ comprises a differential amplifier However, $A_i$ is not so limited. Any type of amplifier having an inverting input terminal can be used. Where high speed operation is not needed, operational amplifiers may be used.

FIG. 6 depicts another timing generator, which is similar to that of FIG. 2, except that differential amplifiers $A_1$, $A_2$ .etc, and control circuit 5 are replaced with a differential amplifier $A_0$ and a D/A converter 9. The saturated amplitude of the output signal from amplifier $A_0$ is variable. The inverting input terminal of this amplifier is connected to the node N, while the non-inverting input terminal has a third voltage $V_B$ supplied thereto. A capacitor $C_0$ is connected between the inverting input terminal and the output terminal of amplifier $A_0$.

The combination of amplifier $A_0$ and capacitor $C_0$ forms a mirror amplifier The voltage at the inverting input terminal of amplifier $A_0$ is compared with fourth voltage $V_{TH}$ by comparator 7. D/A converter 9 controls the amplitude of the output signal from amplifier $A_0$ in response to the data supplied to the D/a converter. Converter 9 forms a setting means for setting the equivalent input capacitance produced in the linear region of the mirror amplifier according to the input data.

The operation of the embodiment of FIG.6 is next described with reference to the timing chart of FIG. 7. When switch 3 is turned ON, voltage $V_N$ at node N is equal to first voltage $V_{CC}$ (see FIG. 7(B)).

At this time, the output voltage from amplifier $A_0$ is $V_L$. When input signal pulse $V_i$ (see FIG. 7(A)) is applied to input terminal 1 and switch 3 is turned OFF, the capacitor connected to node N is electrically discharged by constant current source 4. As a result, voltage $V_N$ at the node drops rapidly (see FIG. 7(B)).

When node voltage $V_N$ differs greatly from third voltage $V_B$, the output from amplifier $A_0$ is saturated and maintained either at $V_L$ ($V_N > V_B$) or at $V_H$ ($V_N > V_B$). Thus, capacitive component $C_N$ (which is equivalent input capacitance) connected to node N is given by the following equation:

$$C_N = C_0 + C_S \quad (8)$$

wherein $C_S$ is stray capacitance. Time $\Delta t_{dl}$ taken for node voltage $V_N$ to change by $\Delta V_N$ is given by the following equation: $\Delta t_{dl} = (C_0 + C_S) \Delta V_N / I \quad (9)$ Where node voltage $V_N$ is close to third voltage $V_B$, amplifier $A_0$ operates linearly. The output voltage from amplifier $A_0$ is varied from $V_L$ to $V_H$ by mirror integration. At this time, electric charge $C_0(V_H - V_L)$ flows into capacitor $C_0$ from the output of amplifier $A_0$. This charge is supplied by constant current source 4. The time required for this process is equivalently given by the following equation:

$$t_{d2} = C_0(V_H - V_L)/I \quad (10)$$

The time taken for node voltage $V_N$ to change is increased accordingly. Thus, when input pulse $V_i$ is applied, node voltage $V_N$ begins to decrease. From equations (9) and (10), the time $t_d$ taken for the voltage to pass through the threshold voltage $V_{TH}$ for comparator 7 is given by the following equation:

$$t_d = (C_0 + C_S)(V_{CC} - V_{TH})I + C_0(V_H - V_L)/I \quad (11)$$

As can be seen from equation (11), the equivalent input capacitance of the mirror amplifier can be set according to the input data and the delay time can be controlled by changing the saturated amplitude ($V_H - V_L$) of the output signal from amplifier $A_0$ by the output from D/A converter 9. When switch 3 is turned ON again (see FIG. 7(C)), the node voltage $V_N$ is electrically charged through switch 3 and returns to potential $V_{CC}$.

Figure 8:
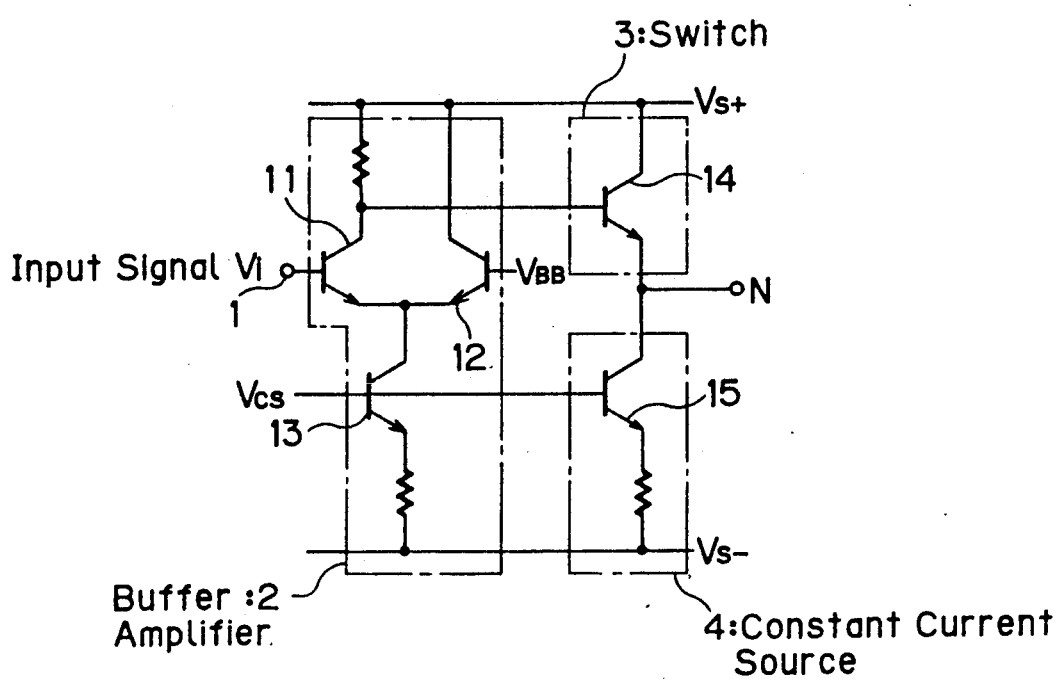
FIG. 8 is a circuit diagram depicting a specific example of a part of the embodiment of FIG. 6.

FIG. 8 depicts a combination of buffer amplifier 2, switch 3, and constant current source 4 shown in FIG. 6. A differential amplifier is formed by transistors 11 and 12. A current regulated circuit includes a transistor 13. A buffer amplifier 2 is formed by the differential amplifier and the current regulated circuit. A transistor 14 whose base is controlled by the output signal from the buffer amplifier 2 forms a switch 3. Another current regulated circuit including a transistor 15 forms constant current source 4 which is controlled by voltage $V_{CS}$ in the same way as transistor 13.

Figure 9:
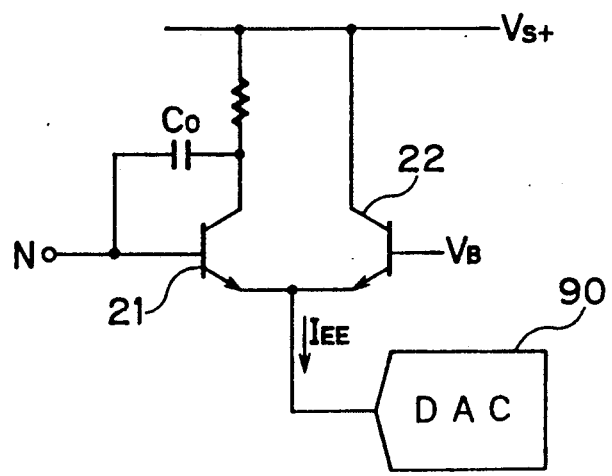
FIG. 9 is a block diagram depicting a first specific example of another part of the embodiment of FIG. 6.

FIG. 9 depicts a circuit wherein the amplitude of the output signal from amplifier $A_0$ shown in FIG. 6, is controlled by a D/A converter 90 delivering an output current. Converter 90 controls emitter current $I_{EE}$ in transistors 21 and 22 which together form a a differential amplifier. In this way, the amplitude of the output signal from the differential amplifier is varied. The output from the collector of transistor 21 is fed back to the base via capacitance $C_0$, the base being connected to node N.

Figure 10:
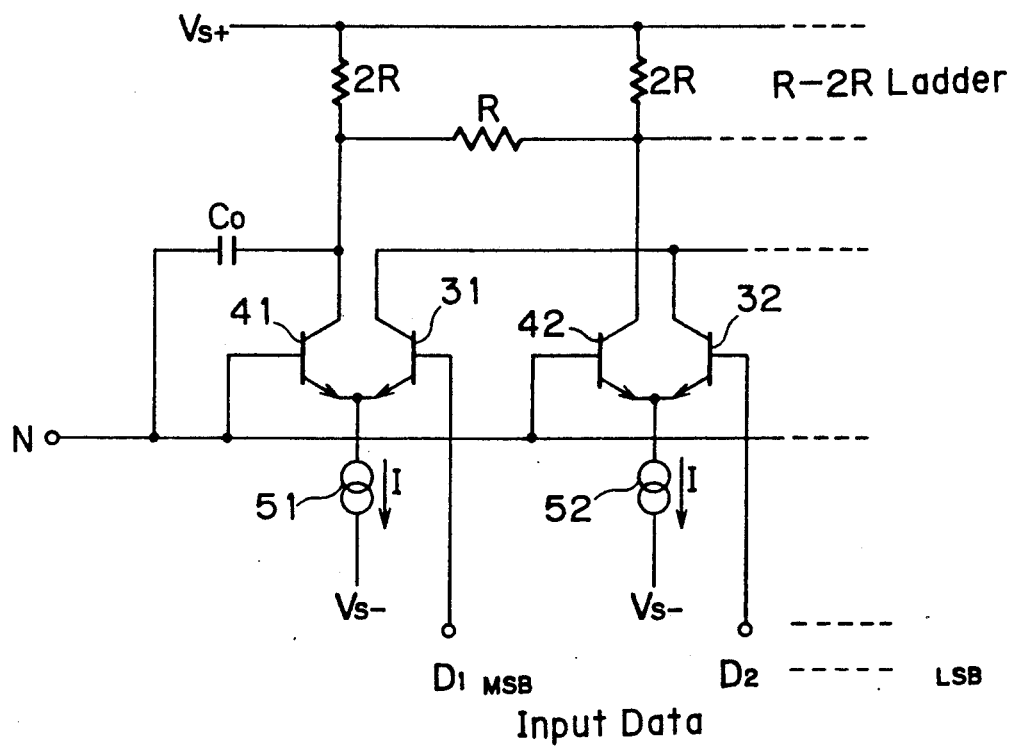
FIG. 10 is a circuit diagram depicting a second specific example of a further part of the embodiment of FIG. 6.

FIG. 10 depicts another circuit which is identical in function to the circuit shown in FIG. 9. A part of a D/A converter , producing an output voltage, is used as amplifier $A_0$. Transistors 31,32 etc., turn ON and OFF current switches , respectively, comprising transistors 41,42, etc, in response to input data $D_1$, $D_2$, etc. Thus, current I,supplied by constant current sources 51, 52, etc, is turned ON and OFF. Digital signals are converted into analog form and appear at the collector of transistor 41 by action of a ladder network comprising resistors R and 2R. Transistor 41 forms the output stage of the D/A converter. Feedback is provided from the collector to the base of transistor 41 via capacitance $C_0$, to produce a mirror capacitance. The base of transistor 41 is connected to node N shown in FIG. 6. In this embodiment, amplifier $A_0$ can be omitted to make the arrangement more simple.

The embodiment of FIG. 6 produces the following advantages in addition to those attained by the embodiment of FIG. 2. Only one amplifier having a mirror effect is needed. Thus, this embodiment is simpler in structure than the embodiment of FIG. 2 which uses a plurality of amplifiers. Where a plurality of amplifiers are used, a plurality of capacitors, which are fabricated to a close tolerance, must be used. Also, the output amplitudes from the plurality of amplifiers must lie within a narrow range. The timing generator shown in FIG. 6 is not required to satisfy these requirements. Furthermore, the FIG. 6 embodiment occupies a small area, since neither a plurality of amplifiers nor a plurality of capacitors are needed. Moreover, high linearity can be easily attained because accuracy is determined by the D/A converter used for setting the amount of delay. Thus, the embodiment achieves high resolution.

In the FIG. 6 embodiment, $A_1$ comprises a differential amplifier; however, it is not so limited. Rather, any arbitrary amplifier, having an inverting input terminal, can be used. Where high speed operation is not needed, operational amplifiers may be used.

In the circuits shown in FIGS. 9 and 10, stray capacitance between the collector and base of each transistor can be used as capacitance $C_0$ in the same way as in the circuit of FIG. 5.

Figure 11:
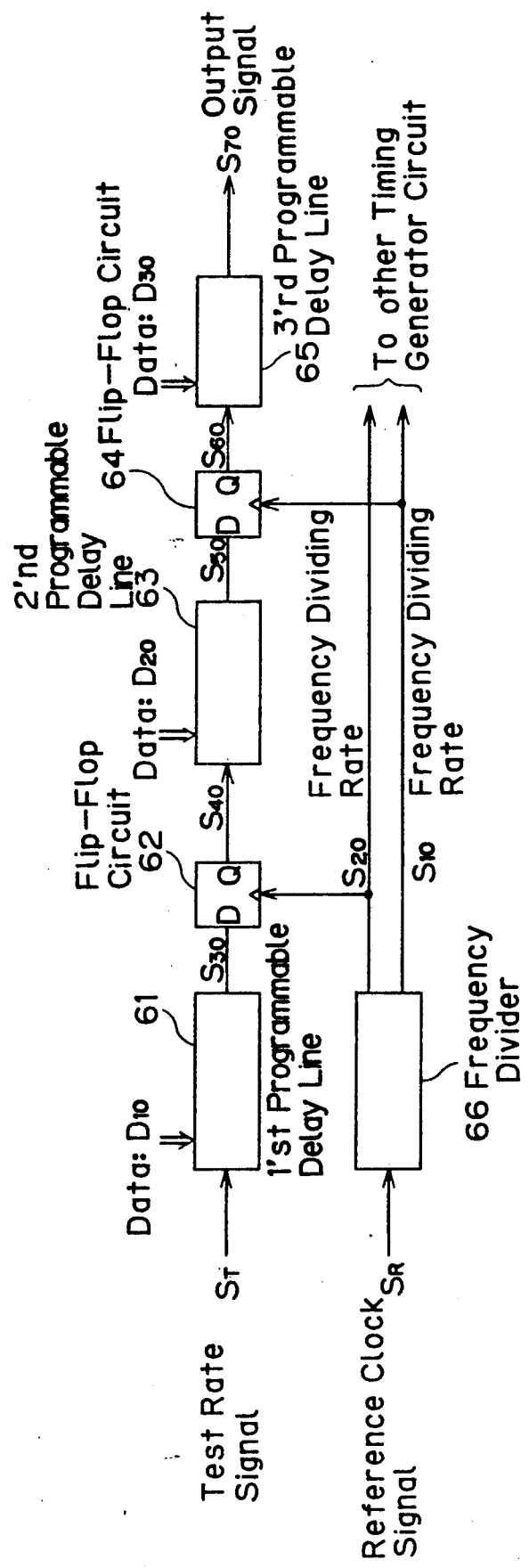
FIG. 11 is a block diagram depicting a circuit using a timing generator of the invention.

FIG. 11 depicts a timing generator, which is fabricated by using the invention timing generator of FIGS. 2 and 6, and which comprises a first programmable delay line 61, a first flip-flop circuit 62 which retains output $S_{30}$ from delay line 61, a second programmable delay line 63 connected to the output of first flip-flop circuit 62, a second flip-flop circuit 64 which retains output $S_{50}$ from second delay line 63, a third programmable delay line 65 connected to the output of second flip-flop circuit 64, and a frequency divider 66 which receives reference clock pulses $S_R$.

First delay line 61 delays test rate signal $S_T$ synchronized with reference clock pulses $S_R$, of 1 GHz, by a certain time corresponding to first input data $D_{10}$, for example, with a time span of 1 ms and a resolution of 32 ns. The pulses forming test rate signal $S_T$ are spaced from each other by 20 ns. Note that the spacing is exaggerated in FIGS. 12(A)–12(D), for ease of understanding.

Second delay line 63 delays output $S_{40}$ from first flip-flop circuit 62 by a given time corresponding to second input data $D_{20}$ with a time span of 32 ns and a resolution of 1 ns. Third delay line 65 delays the output $S_{60}$ from second flip-flop circuit 64 by a given time corresponding to third input data $D_{30}$, with a resolution of 31.25 ps.

The frequency divider 66 produces first clock pulses $S_{10}$ having the same frequency (1/1) as that of reference clock pulses $S_R$ and second clock pulses $S_{20}$ having a frequency one-third secondths (1/32) of the frequency of reference clock pulses $S_R$.

First clock pulses $S_{10}$ trigger second flip-flop circuit 64. Second clock pulses $S_{20}$ trigger first flip-flop circuit 62. First and second clock pulses $S_{10}$ and $S_{20}$, from frequency divider 66, are also supplied to other timing generators, not shown, to generate pulses at different timings. In the FIG. 11 circuit, delay lines 61, 63 and 65 take the form of an IC incorporating the invention timing generators described with reference to FIGS. 2 and 6.

The operation of the timing generator of the FIG. 11 circuit is described with reference to the timing chart of FIGS. 12(A)–12(D). frequency divider 66 produces first clock pulses $S_{10}$ and second clock pulses $S_{20}$ in response to reference clock pulses $S_R$. First clock pulses $S_{10}$ have the same frequency as that of reference clock pulses $S_R$, while the frequency of second clock pulses $S_{20}$ is one-thirty secondths (1/32) of the frequency of the reference clock pulses as mentioned above. The rest rate signal $S_T$ (see FIG. 12(A)) is delayed (see FIG. 12(B)) by a given time corresponding to input data $D_{10}$ by means of delay line 61. Output $S_{30}$ from delay line 61, of a resolution of 32 ns, is allowed to vary within the range of ±16 ns, as described below. When the output is retained in flip-flop circuit 62 in synchronism with second clock pulses $S_{20}$ (see FIG. 12(C)), the errors are removed. Thus, complete retiming is accomplished. (see FIG. 12(D)). The delay time of delay line 61, with respect to the sample pulses $S_{20}$, is allowed to vary from (the instant of the previous sample pulse + the holding time of the flip-flop circuit 62) to (the instant of the next sample pulse − the set-up time of the flip-flop circuit 62).

Output $S_{40}$ from flip-flop circuit 62 is delayed by delay line 63, of a resolution of 1 ns, within one period of second clock pulses $S_{20}$ As a result, the output varies within a range of ±0.5 ns. When this output is retained in flip-flop circuit 64 in synchronism with the first clock pulses $S_{10}$, the errors are eliminated, resulting in complete retiming, in the same way as above mentioned. The delay time of delay line 63, with respect to sample pulses $S_{10}$, is allowed to vary within the same range as that described above for delay line 61. In the case of an ECL, the set-up time and the holding time of flip-flop circuit 64 are on the order of 200 ps.

The output $S_{60}$, from flip-flop circuit 64, is delayed by delay line 65 in response to third input data $D_{30}$ at a higher resolution. As a result, output $S_{70}$ from this timing generator is produced. Since the delay times of delay lines 61 and 63 are readjusted by flip-flop circuits 62 and 64, respectively, errors produced at each stage are not accumulated. Thus, the linearity of the delay time from test rate signal $S_T$ to output $S_{70}$ is excellent.

In timing generator circuit of FIG. 11, the delay times introduced by the delay lines are readjusted by the flip-flop circuits. Thus, the clocks can be delayed with very high step linearity without depending on the error occurring at each step of the delay line. Also, the number of expensive ECL circuits can be reduced since it is not necessary that all stages comprise high speed counters. Each flip-flop circuit can reset itself after producing an output signal. The Then, the flip-flop circuit makes preparation for the next pulse. Also each flip-flop circuit can comprise a monostable multivibrator, since delay is effected only by the leading edge of each pulse. Further, a register or memory may be used to hold data applied to each delay line.

In the timing generator circuit shown in FIG. 11 and the timing chart of FIGS. 12(A)–12(D) used to explain such circuit, retiming is done for the two stages of delay lines. The invention, however, is not limited to such scheme. Retiming may also be done for one stage of delay line, for three stages of delay lines, etc. In fact, retiming can be done for any desired number of stages of delay lines, for example, using clock pulses which are produced from a frequency divider to their respective stages. Also retiming may be done up to the final stage of delay line. The frequency of the reference clock pulses, the time span, and the resolution of each delay line, the subharmonic of the frequency divider, and other factors are not limited to the values used in the above embodiment. Any other desired values may be used.

Advantageously, the invention provides a timing generator which is simple in structure, provides a delay time of good linearity, and is operable at high speeds.

That is to say, the mirror capacitor is electrically discharged with a constant current in the saturation region and in the linear region. The voltage developed at the inverting input terminal of the mirror amplifier is compared with a constant value to produce a delay time. The delay time, which is produced within the linear region where the inclination of the ramp waveform is mild, is accurately varied in response to the input data. This enables the delay time to be set with high accuracy and high resolution. Since the voltage is compared with a constant value within the saturation region, where the inclination of the ramp waveform is steep, the timing generator is made immune to noise even where the delay time is long. In addition, an inexpensive timing generator circuit having high accuracy and high resolution is readily fabricated from the invention timing generator.

The foregoing description is illustrative of the principles of the invention. Numerous extensions and modifications thereof would be apparent to the worker skilled in the art. All such extensions and modifications are to be considered to be within the spirit and scope of the invention.

What is claimed is:

1. A timing generator for receiving a first timing signal and for producing a second timing signal delayed with respect to the first timing signal by a variable time corresponding to input data, said timing generator comprising
   an amplifier comprising an inverting input terminal, an output terminal, and a capacitor connected between said inverting input terminal and said output terminal;
   a switch connected between said inverting input terminal and a constant voltage source;
   constant current means for applying a constant current to said inverting input terminal of said amplifier to electrically discharge an equivalent input capacitance of said amplifier in a saturation region thereof and in a linear region thereof;
   setting means for setting said equivalent input capacitance produced in said linear region in response to said input data; and
   comparator means for comparing voltage produced at said inverting input terminal in said saturation region with another constant voltage after said linear region has passed, and for producing said second timing signal delayed by a given time after said switch is turned OFF by said first timing signal.

2. A timing generator for receiving a first timing signal and for producing a second timing signal delayed with respect to said first timing signal by a variable time corresponding to input data, said timing generator comprising
   a switch connected to a first voltage source and controlled by said first timing signal;
   a constant current source connected between said switch and a second voltage source;
   a third voltage source outputting a voltage having a value between that of said first voltage source and said second voltage source;
   an amplifier comprising an inverting input terminal and a non-inverting input terminal, and producing an output signal having a variable saturated amplitude, said inverting input terminal being connected to a node between said switch and said constant current source, said non-inverting input terminal being connected to said third voltage source;
   a capacitor connected between said inverting input terminal and an output terminal of said amplifier;
   a fourth voltage source outputting a fourth voltage having a value between that of said third voltage source and said second voltage source;
   comparator means for comparing voltage produced at said inverting input terminal with said fourth voltage, and for producing said second timing signal delayed with respect to said first timing signal;
   digital to analog converter means for controlling saturated amplitude of output signal from said amplifier in response to said input data;
   wherein when voltage at said node changes from a first voltage to said fourth voltage after said switch is turned OFF by said first timing signal, said amplifier performs a mirror integration so that said output signal, near said third voltage.

3. A timing generator for receiving a first timing signal and for producing a second timing signal delayed with respect to said first timing signal by a variable time corresponding to input data, said timing generator comprising
   a switch connected to a first voltage source and controlled by said first timing signal;
   a constant current source connected between said switch and a second voltage source;
   a plurality of amplifiers, each comprising an inverting input terminal and a non-inverting input terminal, each amplifier being capable of being turned ON and OFF, said inverting input terminals of said plurality of amplifiers being connected to a node of said switch and said constant current source, said non-inverting input terminals of said plurality of amplifiers being connected to a third voltage source outputting a voltage having a value between the voltages outputted by said first voltage source and said second voltage source;
   a plurality of capacitors connected between respective inverting input terminals of said plurality of amplifiers and respective output terminals of said plurality of amplifiers;
   a fourth voltage source outputting a fourth voltage having a value between the values of voltages outputted by said third voltage source and said second voltage source;
   comparator means for comparing voltage at said inverting input terminals of said plurality of amplifiers with said fourth voltage, and for producing said second timing signal delayed with respect to said first timing signal;
   control circuit means for producing a plurality of control signals in response to said input data to turn ON and OFF selected ones of said plurality of amplifiers; wherein
   when voltage at said node changes from a first voltage to said fourth voltage after said switch is turned OFF by said first timing signal, an operated one of said plurality of amplifiers performs a mirror integration so that an output from said operated amplifier varies near said third voltage.

4. A timing generator comprising:
   a source of clock pulses;
   a plurality of delay line units connected in series circuit and having different resolutions which are less than one period of clock pulses, said delay line units acting to delay a rate signal synchronized with the clock pulses in response to an input data; and
   flip-flop circuits which hold output signals from said delay line units in response to said clock pulses; wherein each of said delay line units comprises:
   means for receiving a first timing signal;
   an amplifier comprising an inverting input terminal, an output terminal, and a capacitor connected between said inverting input terminal and said output terminal;
   a switch connected between said inverting input terminal and a constant voltage source;
   constant current means for applying a constant current to said inverting input terminal of said amplifier to electrically discharge an equivalent input capacitance of said amplifier in a saturation region thereof and in a linear region thereof;

setting means for setting said equivalent input capacitance produced in said linear region in response to said input data; and comparator means for comparing voltage produced at said inverting input terminal in said saturation region with another constant voltage after said linear region has passed, and for producing a signal delayed by a given time after said switch is turned OFF by said first timing signal.

5. A timing generator comprising:

a source of clock pulses;

a plurality of delay line units connected in series circuit and having different resolutions which are less than one period of clock pulses, said delay line units acting to delay a rate signal synchronized with the clock pulses in response to an input data; and flip-flop circuits which hold output signals from said delay line units in response to said clock pulses;

wherein each of said delay line units comprises:

means for receiving a first timing signal;

a switch connected to a first voltage source and controlled by said first timing signal;

constant current source connected between said switch and a second voltage source;

a third voltage source outputting a voltage having a value between that of said first voltage source and said second voltage source;

an amplifier comprising an inverting input terminal and a non-inverting input terminal, and producing an output signal having a variable saturated amplitude, said inverting input terminal being connected to a node between said switch and said constant current source, said non-inverting input terminal being connected to said third voltage source;

a capacitor connected between said inverting input terminal and an output terminal of said amplifier;

a fourth voltage source outputting a fourth voltage having a value between that of said third voltage source and said second voltage source;

comparator means for comparing voltage produced at said inverting input terminal with said fourth voltage, and for producing a second timing signal delayed with respect to said first timing signal;

digital to analog converter means for controlling said saturated amplitude of said output signal from said amplifier in response to said input data;

wherein when voltage at said node changes from said first voltage to said fourth voltage after said switch is turned OFF by said first timing signal, said amplifier performs a mirror integration so that said output signal of said amplifier varies near said third voltage.

6. A timing generator comprising:

a source of clock pulses;

a plurality of delay line units connected in series circuit and having different resolutions which are less than one period of clock pulses, said delay line units acting to delay a rate signal synchronized with the clock pulses in response to an input data; and flip-flop circuits which hold output signals from said delay line units in response to said clock pulses;

wherein each of said delay line units comprises:

means for receiving a first timing signal;

a switch connected to a first voltage source and controlled by said first timing signal;

constant current source connected between said switch and a second voltage source;

a plurality of amplifiers, each comprising an inverting input terminal and a non-inverting input terminal, each amplifier being capable of being turned ON and OFF, said inverting input terminals of said plurality of amplifier being connected to a node between said switch and said constant current source, said non-inverting input terminals of said plurality of amplifiers being connected to a third voltage source outputting a voltage having a value between the voltage outputted by said first voltage source and said second voltage source;

a plurality of capacitors connected between respectively inverting input terminals of said plurality of amplifiers and respective output terminals of said plurality of amplifiers;

a fourth voltage source outputting a fourth voltage having a value between the values of voltages outputted by said third voltage source and said second voltage source;

comparator means for comparing voltage produced at said inverting input terminals with said fourth voltage, and for producing a second timing signal delayed with respect to said first timing signal;

control circuit means for producing a plurality of control signals in response to said input data to turn ON and OFF selected ones of said plurality of amplifiers; wherein when voltage at said node changes from said first voltage to said fourth voltage after said switch is turned OFF by said first timing signal, an operated one of said plurality of amplifiers performs a mirror integration so that an output signal from said operated amplifier varies near said third voltage.

* * * * *